July 7, 1964

S. J. SCURO 3,139,680

METHOD OF BONDING CONTACTS TO THERMOELECTRIC BODIES

Filed Feb. 8, 1963

INVENTOR.
SAMUEL J. SCURO
BY
J. F. Sheehan
ATTORNEY 3,139,680

METHOD OF BONDING CONTACTS TO THERMOELECTRIC BODIES

Samuel J. Scuro, Verona, Pa., assignor, by mesne assignments, to the United States of America as represented by the Secretary of the Navy Filed Feb. 8, 1963, Ser. No. 257,351
2 Claims. (Cl. 29—472.9)

The present invention relates to thermoelectric devices and to the method of fabricating such devices. In particular, the invention concerns as improved method for providing a mechanically strong low electrical resistance bond between a copper clad steel contact element and a zinc antimonide thermoelectric element.

In the construction of thermoelectric devices difficulties arise in providing a proper bond between a metal contact and the end of a thermoelectric element. Metal contact elements have been joined to a thermoelectric element by using a eutectic solder which has the composition of the thermoelectric element but the joint provided between the contact and the thermoelectric element is not completely satisfactory and consequently efficiency of the assembled thermoelectric element and contact is reduced.

An object of the present invention is to provide a method of joining the surface of a thermoelectric element to the surface of a metallic electrical contact to form a low electrical resistance joint therebetween by direct fusion of the thermoelectric material to the electrical contact.

Another object of the invention is to provide a method for forming a thermoelectric device comprising a thermoelectric element joined to a contact and characterized by a joint having a low electrical resistance and capable of being employed at temperatures of upwardly of 450° C. and withstanding thermal shock and cycling.

Still another object of the invention is to provide a method of joining the surface of a zinc antimonide thermoelectric element to a copper clad steel contact to form a low electrical resistant joint therebetween by direct fusion of the zinc antimonide material to the copper clad steel contact material.

Other objects, advantages and novel features of the invention will become apparent from the following detailed description of the invention when considered in conjunction with the accompanying drawings, wherein.

Figure 1:
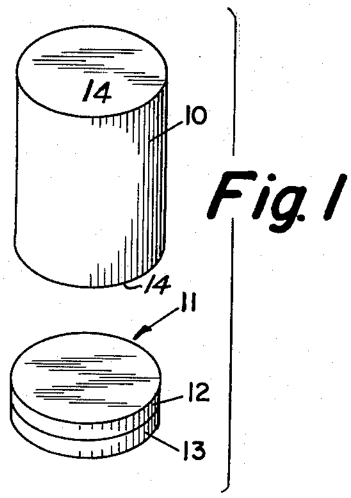
FIG. 1 is an enlarged exploded view in perspective of a thermoelectric device and an electrical contact preparatory to assembling the elements.
Figure 2:
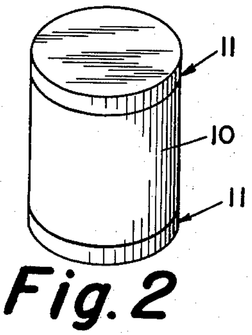
FIG. 2 is an enlarged view of the thermoelectric device of FIG. 1 with electrical contacts assembled therewith at each end.

Referring to FIG. 1, the body of thermoelectric material is shown at 10 and consists of a zinc antimonide pellet. The pellet is suitably shaped for its desired use and is prepared by any suitable means, such as, by powder metallurgy techniques or by casting. The contact element is indicated at 11 and is formed of a relatively thin layer of steel 12 and a layer of copper 13 which may be somewhat thicker than the layer of steel 12 and forms the contact surface of the zinc antimonide thermoelectric assembly. As shown in FIG. 2, the final assembly of the thermoelectric device will have two contacts 11, one at each end of the thermoelectric element 10. The element 10 is formed of zinc antimonide and may be considered as a small cold pressed and sintered pellet. The pellet has its ends 14—14 similarly flattened and polished while the steel layers 12 of the contact elements 11 are similarly flattened and polished so that the end surfaces of the pellet or element 10 conforms substantially uniformly with the steel surfaces of the contacts 11 in order to provide clean and intimate contact between the surfaces and to substantially completely bond the surfaces together when they are assembled.

Figure 3:
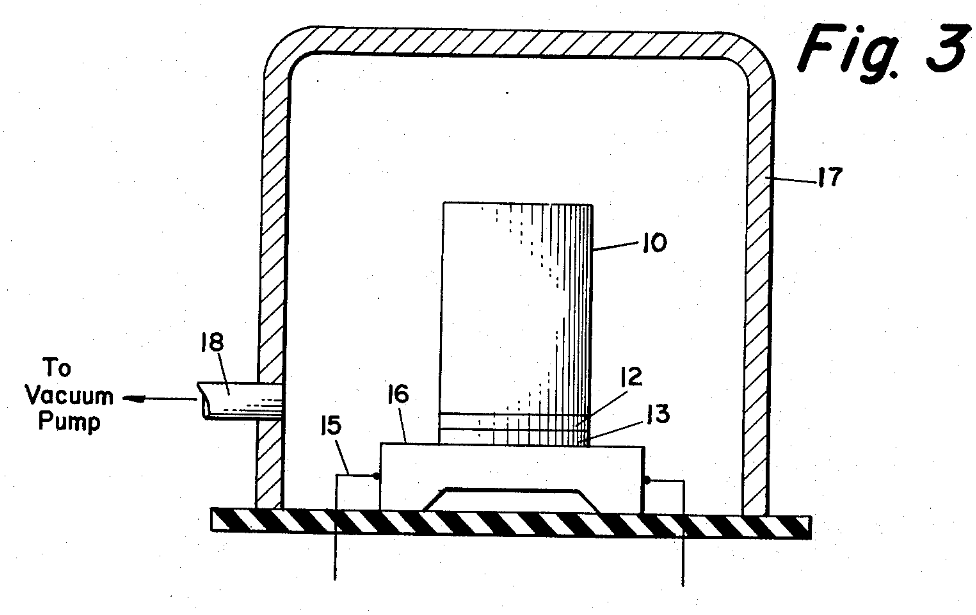
FIG. 3 is a schematic view partially in cross section illustrating the elements of FIG. 1 being bonded.

A preferred arrangement for assembling the contacts is shown in FIG. 3 wherein 15 represents a heater, for example, an electrically operated graphite resistance heater having a heating surface 16 on which a contact element 11 is disposed with its copper clad layer 13 in surface contact with the heating surface 16 of the heater 15. One end surface 14 of the zinc antimonide thermoelectric element or pellet 10 is then placed in surface to surface contact with the steel layer 12 of the contact element 11 and the bonding operation is performed. This operation is carried out in a vacuum system indicated at 17 which is maintained at a pressure of $10^{-3}$ mm. Hg while a temperature of between 425 and 450° C. for a time upwardly of five minutes gave good results with optimum results obtained at a temperature of 450° for three minutes. The specific pressure condition is essential for proper bonding of the elements since at a lower pressure excessive vaporization of the zinc antimonide results. When the heating is carried out at a temperature of 450° C. for three minutes at the specific pressure the process is effective in causing fusion of the steel and zinc antimonide surfaces. By this procedure one contact 11 is applied to one surface of the element 10 and the element 10 upended for the application of the other contact 11. The bonding of the thermoelectric element 10 to the steel surface is of a chemical nature and at the bonding temperature, iron atoms diffuse into the adjacent surfaces of the zinc antimonide.

Obviously many modifications and variations of the present invention are possible in the light of the above teachings. It is therefore to be understood that within the scope of the appended claims the invention may be practiced otherwise than as specifically described.

I claim:

1. In a process for forming a thermoelectric device of a zinc antimonide thermoelectric element and a low resistance copper clad steel contact element, the steps comprising (*a*) assembling the elements with a surface of the zinc antimonide element in intimate contact with the steel surface of the contact element, (*b*) bonding the assembly in a vacuum system at a pressure of $10^{-3}$ mm. Hg while applying heat directly to the copper surface of the contact element maintained within a range of 425–450° C. for upwardly of five minutes to provide a fused joint between the surface of the zinc antimonide element and the steel surface of the contact element.

2. In a process for forming a thermoelectric device of a zinc antimonide thermoelectric pellet and a low resistance copper clad steel contact element, the steps comprising (*a*) flattening and polishing an end surface of the zinc antimonide pellet, (*b*) flattening and polishing the steel surface of the contact element, (*c*) assembling the zinc antimonide pellet and contact element with the flattened surfaces in intimate contact, (*d*) bonding the assembly in a vacuum chamber maintained at a pressure of $10^{-3}$ mm. Hg while applying heat directly to the copper surface of the contact element maintained at a temperature of 450° C. for upwardly of three minutes to provide a fused joint between the zinc antimonide and steel surfaces.

References Cited in the file of this patent

UNITED STATES PATENTS 3,000,092 Scuro _______________ Sept. 19, 1961